(12) United States Patent
Kim et al.

(10) Patent No.: US 11,030,359 B2
(45) Date of Patent: Jun. 8, 2021

(54) METHOD AND SYSTEM FOR PROVIDING MIXED REALITY SERVICE

(71) Applicant: DONGWOO E&C, Gyeongsangbuk-do (KR)

(72) Inventors: Sang Hoon Kim, Gyeongsangbuk-do (KR); Gyung Jin Kim, Daegu (KR)

(73) Assignee: DONGWOO E&C, Gumi-si (KR)

( * ) Notice: Subject to any disclaimer, the term of this patent is extended or adjusted under 35 U.S.C. 154(b) by 0 days.

(21) Appl. No.: 16/956,392

(22) PCT Filed: Dec. 3, 2018

(86) PCT No.: PCT/KR2018/015197
§ 371 (c)(1),
(2) Date: Jun. 19, 2020

(87) PCT Pub. No.: WO2019/124818
PCT Pub. Date: Jun. 27, 2019

(65) Prior Publication Data
US 2020/0334396 A1     Oct. 22, 2020

(30) Foreign Application Priority Data

Dec. 19, 2017 (KR) .......................... 10-2017-0175376
Dec. 19, 2017 (KR) .......................... 10-2018-0096262

(51) Int. Cl.
*G06T 19/20*       (2011.01)
*G06F 30/13*       (2020.01)
(Continued)

(52) U.S. Cl.
CPC .............. *G06F 30/13* (2020.01); *G06T 17/10* (2013.01); *G06T 19/006* (2013.01); *G06T 19/20* (2013.01)

(58) Field of Classification Search
CPC ....... G06T 19/006; G06T 19/20; G06T 17/10; G06F 30/13
(Continued)

(56) References Cited

U.S. PATENT DOCUMENTS

2014/0298217 A1* 10/2014 Lehtiniemi ............ G06Q 10/06
                                                                    715/765
2018/0114361 A1*  4/2018 Carrington .............. G06F 3/012
2020/0151950 A1*  5/2020 Carrington .............. G06F 3/012

FOREIGN PATENT DOCUMENTS

KR    10-2009-0029350 A      3/2009
KR    10-2011-0107542 A     10/2011
(Continued)

*Primary Examiner* — Thomas J Lett
(74) *Attorney, Agent, or Firm* — IP & T Group LLP

(57) ABSTRACT

The present invention relates to a method for providing a mixed reality service of a server and a system for performing the same, the method comprising the steps of: loading three-dimensional modeling data including design information for arbitrary building; generating a virtual image for the three-dimensional modeling data and at least one user interface on the basis of tracking information transmitted from a terminal; and transmitting the virtual image to the terminal, wherein the tracking information includes at least one of geographical position information of the terminal, identification information of an actual space where the terminal is located, three-dimensional rotation information, and speed information, and wherein the virtual image is generated such that the actual size of the building may be displayed according to the design information, and is synthesized with an actual image in the at least one terminal and displayed as a mixed reality image.

10 Claims, 8 Drawing Sheets

(51) Int. Cl.
*G06T 17/10* (2006.01)
*G06T 19/00* (2011.01)
(58) Field of Classification Search
USPC ......................................................... 345/633
See application file for complete search history.

(56) References Cited

FOREIGN PATENT DOCUMENTS

| | | |
|---|---|---|
| KR | 10-2015-0058617 A | 5/2015 |
| KR | 10-2015-0068088 A | 6/2015 |
| KR | 10-2016-0033495 A | 3/2016 |

\* cited by examiner

METHOD AND SYSTEM FOR PROVIDING MIXED REALITY SERVICE

This application is a national stage application of PCT/KR2018/015197 filed on Dec. 3, 2018, which claims priority of Korean patent application numbers 10-2017-0175376 and 10-2018-0096262 filed on Dec. 19, 2017. The disclosure of each of the foregoing applications is incorporated herein by reference in its entirety.

TECHNICAL FIELD

The present invention relates to a mixed reality service providing method and system, and more specifically, to a mixed reality service providing method and system in which three-dimensional modeling data corresponding to a building in a construction site is provided as a mixed reality image having an actual size of the building so that management and maintenance of the building are easily performed.

BACKGROUND ART

Recently, with the rapid development of three-dimensional image processing technology, services using virtual reality (VR) or augmented reality (AR) are being provided in various fields such as movies, games, and interiors. Mixed reality (MR), which appeared after AR, synthesizes and displays a reality image with a virtual image implemented using three-dimensional modeling data and thus provides an image without a boundary between the reality image and the virtual image to a user.

Meanwhile, in the field of building design, technologies, in which design data is made into three-dimensional modeling data so that structures of buildings are recognized more three-dimensionally, are also being developed.

However, until now, in the field of building design, the application of MR is merely to recognize a reality space and place small interior structures, such as furniture, therein. In the actual design site, there is a problem in that a lot of manpower and time are consumed because sizes of buildings are verified and managed manually.

DISCLOSURE

Technical Problem

The present invention is directed to providing a mixed reality service providing method and system in which three-dimensional modeling data corresponding to a building in a construction site is displayed as a mixed reality image having an actual size of the building.

The present invention is also directed to providing a mixed reality service providing method and system in which three-dimensional modeling data displayed as a mixed reality image in a mixed reality space is edited in real time and shared with other workers.

Technical Solution

One aspect of the present invention provides a mixed reality service providing method, which is a method of providing a mixed reality service of a server. The method includes loading three-dimensional modeling data including design information about an arbitrary building, generating virtual images of the three-dimensional modeling data and at least one user interface on the basis of tracking information transmitted from a terminal, and transmitting the virtual images to the terminal. The tracking information includes at least one of geographical position information of the terminal, identification information about a reality space in which the terminal is located, three-dimensional rotation information, and speed information, and the virtual image is generated such that the building is displayed at an actual size according to the design information, and is synthesized with a reality image in at least one terminal and the synthesized image is displayed as a mixed reality image.

The generating of the virtual image may include obtaining an exterior or interior image of the building according to the geographical position information of the terminal, extracting one region corresponding to a display region in front of the terminal from the obtained image according to the tracking information of the terminal, and generating the virtual image from the extracted region.

The generating of the virtual image may further include, when the building is built with a plurality of floors, obtaining the interior image for any floor selected by a user input or the tracking information.

The at least one user interface may include a user interface for at least one of addition, edit, delete, and memo management of the design information about the building.

The generating of the virtual images may include arranging the user interface for at least one object on the at least one object in the building and generating the virtual image.

The method may further include receiving a request for processing of the three-dimensional modeling data through the at least one user interface, editing the three-dimensional modeling data in response to the request for the processing, regenerating the virtual image on the basis of the edited three-dimensional modeling data, and transmitting the regenerated virtual image to the terminal.

The method may further include, after the transmitting of the virtual images to the terminal, receiving changed tracking information from the terminal, regenerating the virtual image of the three-dimensional modeling data and the at least one user interface on the basis of the changed tracking information, and transmitting the regenerated virtual image to the terminal.

Another aspect of the present invention provides a mixed reality service providing system, which is a system for providing a mixed reality service. The system includes a terminal configured to collect and transmit tracking information while a mixed reality service is used, and a server configured to load three-dimensional modeling data including design information about an arbitrary building, generate virtual images of the three-dimensional modeling data and at least one user interface on the basis of the tracking information transmitted from the terminal, and transmit the generated virtual images to the terminal. The tracking information includes at least one of geographical position information of the terminal, identification information about a reality space in which the terminal is located, three-dimensional rotation information, and speed information, and the virtual image is generated such that the building is displayed at an actual size according to the design information, and is synthesized with a reality image in at least one terminal and the synthesized image is displayed as a mixed reality image.

The server may obtain an exterior or interior image of the building according to the geographical position information of the terminal, extract one region corresponding to a display region in front of the terminal from the obtained image according to the tracking information of the terminal, and generate the virtual image.

When the building is built with a plurality of floors, the server may obtain the interior image for any floor selected by an input received from the terminal or the tracking information.

The terminal may transmit a request for processing of the three-dimensional modeling data on the basis of a user input received through the at least one user interface to the server, and the server may edit the three-dimensional modeling data in response to the request for the processing, regenerate the virtual image on the basis of the edited three-dimensional modeling data, and transmit the regenerated virtual image to the terminal.

Advantageous Effects

According to a mixed reality service providing method and system according to the present invention, it is possible to compare a building to three-dimensional modeling data having an actual size of the building using a mixed realty image in a construction site and thus easily perform verification, management, and maintenance of the building.

Further, according to the mixed reality service providing method and system according to the present invention, it is possible to edit three-dimensional modeling data displayed as a mixed reality image in real time and share the edited three-dimensional modeling data with other workers.

DETAILED DESCRIPTION OF THE INVENTION

In the description of embodiments in this specification, when it is determined that detailed descriptions of related well-known configurations or functions unnecessarily obscure the gist of the present invention, detailed descriptions thereof will be omitted.

The expressions "includes," "can include," etc. used herein indicate the presence of the disclosed corresponding functions, operations, elements, and the like, and do not limit one or more additional functions, operations, elements, and the like. In addition, it should be further understood that the terms "comprise," "comprising," "include," and/or "including," when used herein, specify the presence of stated features, integers, steps, operations, elements, parts, or combinations thereof but do not preclude the presence or addition of one or more other features, integers, steps, operations, elements, parts, or combinations thereof.

As used herein, the singular forms "a," "an," and "the" are intended to include the plural forms as well, unless the context clearly indicates otherwise.

A mixed reality service providing method and system according to the present invention may be provided for building design. More specifically, the mixed reality service providing method and system according to the present invention may be configured to display design data of a building, which serves as three-dimensional modeling data, on a plurality of terminals of users entering a mixed reality conference room as mixed reality and to manage (add, modify, delete, or the like) design information.

Hereinafter, the present invention will be described with reference to the accompanying drawings.

Figure 1:
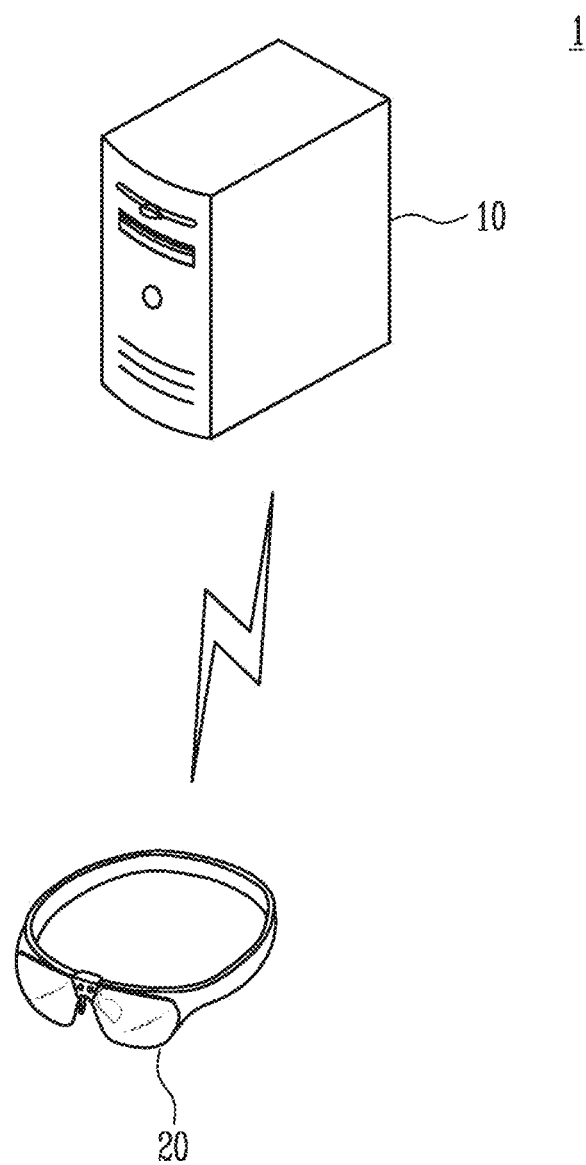
FIG. 1 is a diagram illustrating a network structure of a mixed reality service providing system according to the present invention.

FIG. 1 is a diagram illustrating a network structure of a mixed reality service providing system according to the present invention.

Referring to FIG. 1, a mixed reality service providing system 1 according to the present invention may include a server 10 that provides a mixed reality service and a terminal 20 to which the mixed reality service is provided.

The server 10 is provided in order to provide the mixed reality service according to the present invention and may be a network server, an application server, a domain server, or the like operated by a provider of the mixed reality service.

When the server 10 receives a request for providing of a mixed reality service from the terminal 20, the server 10 generates a virtual image using three-dimensional modeling data and provides the generated virtual image to the terminal 20. The virtual image provided to the terminal 20 may be synthesized with a realty image captured by the terminal 20 and the synthesized image may be displayed as a mixed reality image.

The server 10 may also provide various user interfaces for performing additional processing on the three-dimensional modeling data in the form of virtual images to the terminal 20. Further, the server 10 may modify and manage the three-dimensional modeling data in response user commands received through the user interfaces.

The terminal 20 performs data communication with the server 10 to be provided with the mixed reality service. The terminal 20 may synthesize the virtual image received from the server 10 with the reality image captured by the terminal 20 to generate a mixed reality image and display the generated mixed reality image as a left-eye image and a right-eye image so that the user may realistically experience the three-dimensional modeling data in a reality space.

In various embodiments of the present invention, the three-dimensional modeling data may be modeling data for building design. In particular, the three-dimensional modeling data may be Industry Foundation Classes (IFC) data as building information modeling (BIM) data, but the present invention is not limited thereto. The three-dimensional modeling data for building design may include information associated with a structure, a shape, a size, materials, quality of materials, colors, patterns, and facilities of the building.

The server 10 and the terminal 20 are connected to each other via a network to perform data communication and perform a control operation for the mixed reality service. A more detailed description thereof will be given below.

Figure 2:
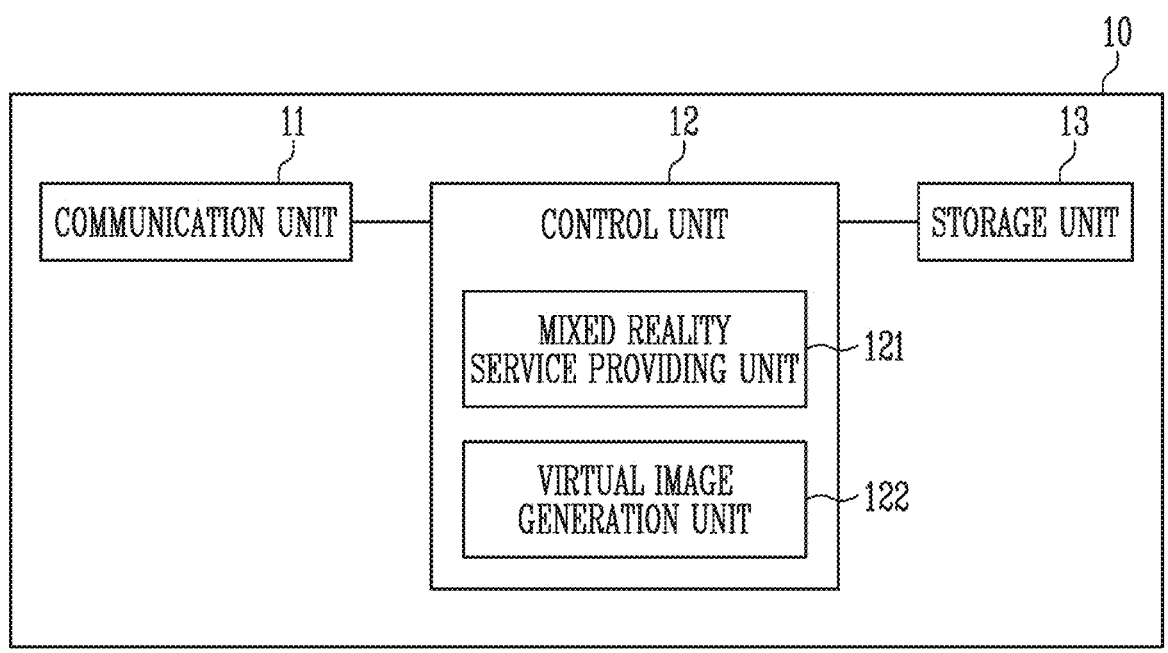
FIG. 2 is a diagram illustrating a configuration of a server according to the present invention.

FIG. 2 is a diagram illustrating a configuration of the server according to the present invention.

Referring to FIG. 2, the server 10 may include a communication unit 11, a control unit 12, and a storage unit 13.

The communication unit 11 may transmit and receive data to and from an external device via a network. For example, the communication unit 11 may receive a request corresponding to a user input and information required for generating a virtual image from the terminal 20 and transmit the virtual image which will be synthesized with a reality image to the terminal 20 under the control of the control unit 12.

In order to provide the mixed reality service according to the present invention, the control unit 12 is configured to control each component of the server 10. More specifically, the control unit 12 may include a mixed reality service providing unit 121 and a virtual image generation unit 122.

The mixed reality service providing unit 121 performs various types of control operations for providing the mixed reality service to the terminal 20.

In one embodiment, the mixed reality service providing unit 121 may generate and manage a user account of the terminal 20 to which the mixed reality service is provided. The mixed reality service providing unit 121 may store and manage data, which generated or obtained through the mixed reality service, in association with the user account. For example, the mixed reality service providing unit 121 may store and manage an identification (ID) and a password as pieces of identification information for identifying the user account and store and manage modeling data associated with the corresponding user account in a data directory corresponding to the user account.

When the mixed reality service is driven by a request of the terminal 20, the mixed reality service providing unit 121 may receive information required for generating the virtual image, for example, tracking information, from the terminal 20, and transmit the received information to the virtual image generation unit 122. Further, the mixed reality service providing unit 121 may transmit the virtual image generated by the virtual image generation unit 122 to the terminal 20 so that the virtual image may be synthesized with the reality image in the terminal 20 to generate a mixed reality image.

While the mixed reality service is provided, the mixed reality service providing unit 121 may perform processing on the three-dimensional modeling data in response to the user input received from the terminal 20, for example, perform addition, edition, deletion, or memo management for design information, and store the three-dimensional modeling data. The mixed reality service providing unit 121 may transmit the edited three-dimensional modeling data to the virtual image generation unit 122 so that the virtual image may be generated based on the edited three-dimensional modeling data. When the three-dimensional modeling data is edited by an arbitrary terminal 20, the virtual image regenerated based on the edited three-dimensional modeling data may be transmitted to the corresponding terminal 20 and one or more other devices. Accordingly, the devices to which the mixed reality service is provided may perform collaboration while sharing the editing state of the three-dimensional modeling data.

The virtual image generation unit 122 may generate the virtual image on the basis of the tracking information received from the terminal 20. The tracking information may include, for example, identification information (e.g., mesh network information) about the reality space of the terminal 20, geographical position information, three-dimensional rotation information, speed information, and the like of the terminal 20.

The virtual image generation unit 122 may generate the virtual image using the three-dimensional modeling data on the basis of the tracking information of the terminal 20 which is received from the terminal 20. The virtual image generation unit 122 may generate the virtual image at an actual size of the three-dimensional modeling data and determine a display region of the three-dimensional modeling data according to the tracking information to generate the virtual image.

Further, the virtual image generation unit 122 may generate a user interface for performing processing on the three-dimensional modeling data, for example, a user interface for addition, edit, delete, memo management (e.g., memo addition, memo edit, memo delete, etc.) of design information in the form of a virtual image. In this case, the virtual image generation unit 122 may generate the virtual image by rotating and enlarging or reducing the user interface according to a three-dimensional shape of an object or tracking information.

The above-described components of the control unit 12 may be implemented as physically separate devices in the control unit 12, but the technological scope of the present invention is not limited thereto. That is, the above-described components of the control unit 12 may be modularized or programmed in one physical processor. Further, the above-described components of the control unit 12 are merely divided into operational aspects of the control unit 12, and at least one or all of the above-described components may be integrated into one component.

The storage unit 13 may store an operating system, programs, software, and the like required for the operation of the server 10. In various embodiments of the present invention, the storage unit 13 may store and manage at least one piece of three-dimensional modeling data. In one embodiment, at least one piece of three-dimensional modeling data may be stored in association with a user account and geographical position information.

Figure 3:
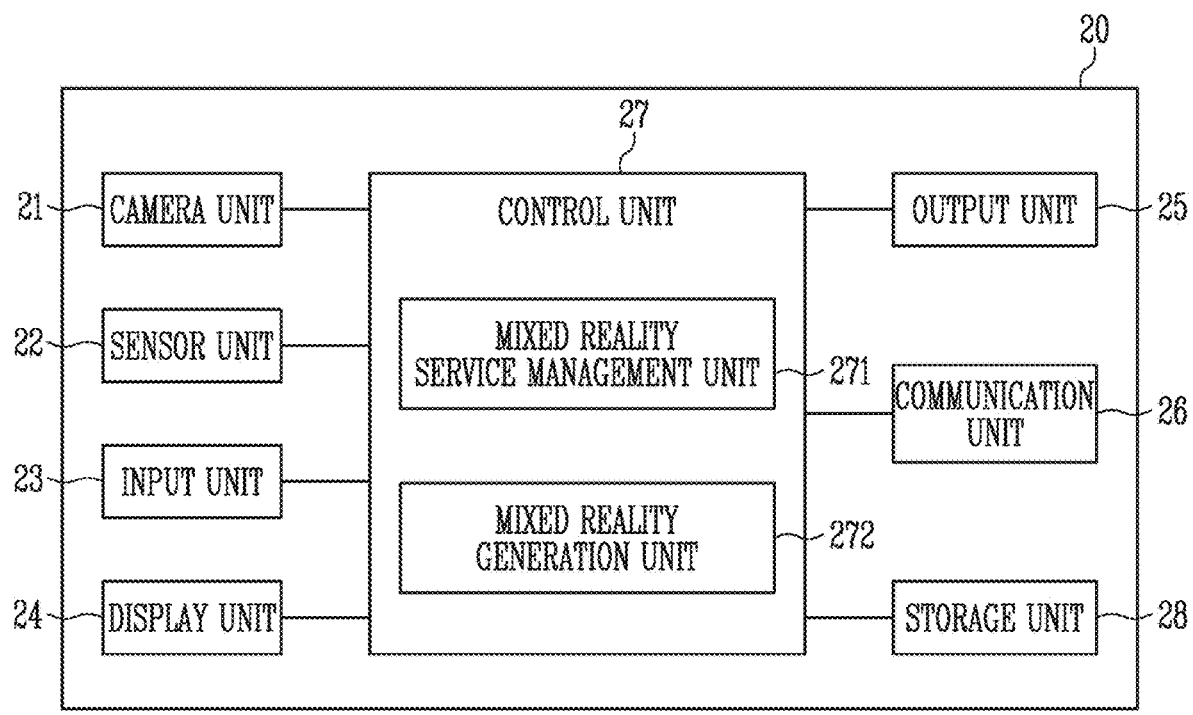
FIG. 3 is a diagram illustrating a configuration of a terminal according to the present invention.

FIG. 3 is a diagram illustrating a configuration of the terminal according to the present invention.

Referring to FIG. 3, the terminal 20 according to the present invention may include a camera unit 21, a sensor unit 22, an input unit 23, a display unit 24, an output unit 25, a communication unit 26, a control unit 27, and a storage unit 28.

The camera unit 21 includes at least one camera module to capture an image in front of the user. In various embodiments of the present invention, the camera unit 21 may include a depth camera that can identify a shape and a sense of depth of a reality space (subject) of a user. Further, the camera unit 21 may include an infrared camera or the like for photographing a hand gesture of the user.

The sensor unit 22 may include at least one sensor that can sense various pieces of information about operations of the terminal 20. In various embodiments of the present invention, the sensor unit 22 may include a Global Positioning System (GPS) sensor for sensing a geographical position of the user. Further, the sensor unit 22 may include a gyro sensor, a speed sensor, an acceleration sensor, and the like for sensing movements such as three-dimensional rotation, inclination, and a speed of the terminal 20.

The input unit 23 receives various inputs from the user. The input unit 23 may include a touch pad, a keypad, a jog dial, a dome switch, a button, or the like. Alternatively, in one embodiment, when the input unit 23 receives a hand gesture of the user through the camera unit 21 as an input, the input unit 23 may be configured to perform an operation of identifying the hand gesture photographed by the camera unit 21. Further, in various embodiments, the input unit 23 may further include a microphone that receives sound, such as a user's voice, and processes the sound as electrical voice data.

The display unit 24 may visually display various pieces of information processed by the terminal 20. In various embodiments of the present invention, when the terminal 20 is provided as a head-mounted display 30, the display unit 24 may include a display unit for a left eye which displays a left-eye image, and a display unit for a right eye which displays a right-eve image.

The output unit 25 is configured to output pieces of information processed by the terminal 20 in various forms such as sound, vibration, and light. To this end, the output unit 25 may include a speaker, a haptic module, a light-emitting diode (LED) lamp, and the like.

The communication unit 26 may transmit and receive data to and from the outside via a network. For example, the communication unit 26 may transmit various requests and/or various pieces of information for being provided with the mixed reality service to the server 10 and receive three-dimensional modeling data and/or virtual images about various objects from the server 10 under the control of the control unit 27.

In order to be provided with the mixed reality service according to the present invention, the control unit 27 is configured to control each component of the terminal 20. More specifically, the control unit 27 may include a mixed reality service management unit 271 and a mixed reality generation unit 272.

The mixed reality service management unit 271 controls operations associated with the mixed reality service provided by the server 10.

Specifically, the mixed reality service management unit 271 may transmit a request for generation and/or management of a user account or a request for login with the user account to the server 10 in response to the user input. The mixed reality service management unit 271 may receive an ID, a password, and the like as identification information for generating the user account or logging in with the user account from the user and transmit the received ID and the password to the server 10.

The mixed reality service management unit 271 may transmit a request for driving of the mixed reality service to the server 10 in response to the user input. When the mixed reality service is driven, the mixed reality service management unit 271 may collect tracking information using the camera unit 21 and/or the sensor unit 22 and transmit the collected tracking information to the server 10. The mixed reality service management unit 271 may receive a virtual image, which is generated based on the tracking information, from the server 10. The mixed real service management unit 271 may transmit the received virtual image to the mixed reality generation unit 272 and synthesize a reality image captured by the camera unit 21 with the virtual image so that a mixed reality image is generated.

While the mixed reality service is provided, the mixed reality service management unit 271 may receive a user input, for example, an input for addition, edit, delete, memo management, etc. for any object in the three-dimensional modeling data, through at least one user interface which is received from the server 10 and displayed by the mixed reality generation unit 272. The mixed reality service management unit 271 may process the user input to transmit the processed user input to the server 10 and receive and process a response thereof from the server 10.

The mixed reality generation unit 272 synthesizes the reality image captured by the camera unit 21 with the virtual image received from the server 10 to generate the mixed reality image. The generated mixed reality image may be displayed through the display unit 24.

In one embodiment, as will be described below, when the terminal 20 is provided as a head-mounted display 30, the mixed reality generation unit 272 may generate a left-eye image and a right-eye image of the mixed reality image. The generated left-eye image and right-eye image may be displayed on the display unit for a left eye and the display unit for a right eye of the head-mounted display 30, respectively.

The storage unit 28 may store an operating system, programs, software, and the like required for the operation of the terminal 20.

Figure 4:
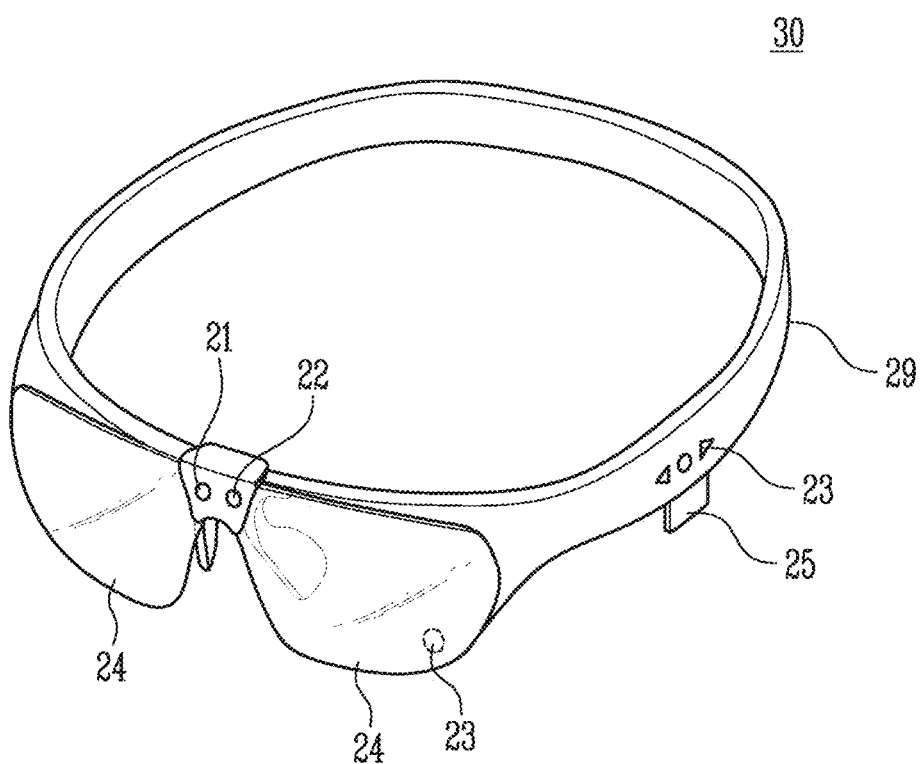
FIG. 4 is a diagram illustrating an example in which a terminal according to the present invention is implemented as a head-mounted display device.

Meanwhile, in various embodiments of the present invention, the terminal 20 may be provided as a head-mounted display 30 as illustrated in FIG. 4.

The head-mounted display 30 may be provided as a frame 29. The frame 29 may be formed of a flexible material to be easily worn on the user's head and may be formed, for example, in the form of glasses to be worn on the user's face. The frame 29 may be referred to as a main body portion or a body portion. The camera unit 21, the sensor unit 22, the input unit 23, the display unit 24, and the output unit 25, which are described above, may be provided in the frame 29.

The display unit 24 may include a display unit 24 for a left eye and a display unit 24 for a right eye which correspond to left eye and a right eye, respectively, while being worn by the user. Accordingly, the head-mounted display 30 may allow the user to feel a sense of depth corresponding to parallax between an image for a left eye and an image for a right eye and experience a more realistic mixed reality space.

However, a structure of the head-mounted display 30 is not limited to the above, and the head-mounted display may have various structures and shapes.

Hereinafter, a mixed reality service providing method will be described in more detail with reference to the mixed reality service providing system 1 according to the present invention. The mixed reality service providing method to be described below may be performed using applications, programs, software, or the like installed on the terminal 20 or may be performed using a Hypertext Transfer Protocol (HTTP)-based web service. However, the technological scope of the present invention is not limited thereto, and the mixed reality service providing method according to the present invention may be performed in various manners.

Figure 5:
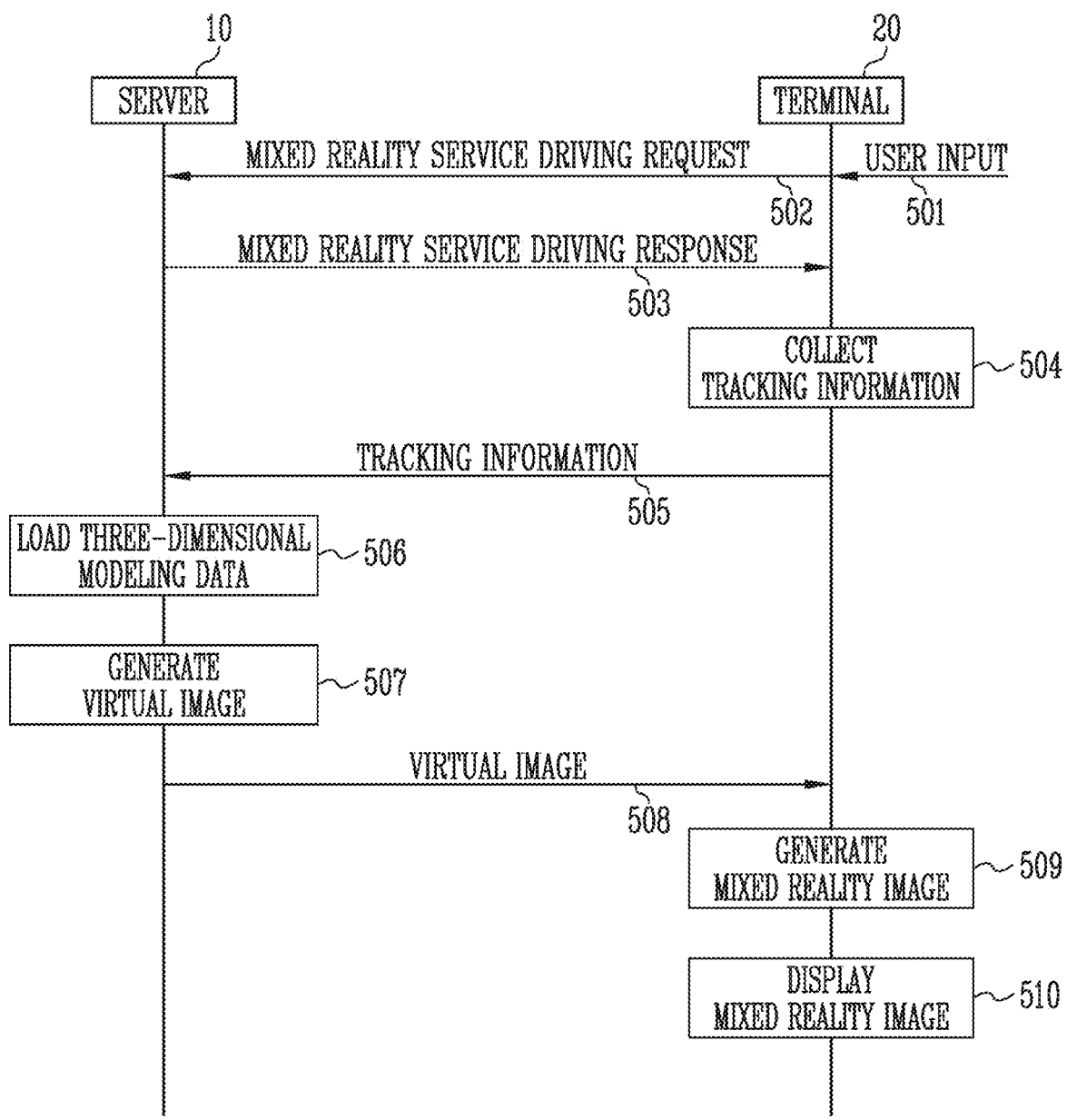
FIG. 5 is a flowchart illustrating a mixed reality service providing method according to the present invention.

FIG. 5 is a flowchart illustrating the mixed reality service providing method according to the present invention.

Referring to FIG. 5, the terminal 20 may receive a user input for driving a mixed reality service (501). For example, the user input for driving the mixed reality service may be received by executing applications, programs, or software for providing the mixed reality service or by moving to a web page that provides the mixed reality service.

The terminal 20 may transmit a request for driving of the mixed reality service to the server 10 in response to the user input (502).

The server 10 may transmit a driving response with respect to the driving request of the terminal 20 to the terminal 20 (503). In various embodiments, the server 10 may perform device authentication and/or security authentication on the terminal 20, determine whether to provide the mixed reality service to the terminal 20, and transmit the driving response to the terminal 20.

In various embodiments, the authentication process described above may not be performed separately.

In various embodiments, after the initial driving of the mixed reality service, the server 10 and the terminal 20 may perform an operation of generating a user account and/or an operation for logging in with the user account. Specifically, the terminal 20 may transmit a request for generation of the user account or a request for login with the user account to the server 10 in response to the user input. The request for the generation of the user account or the request for the login with the user account may include, for example, an ID and a password as identification information of the user. The server 10 may store the identification information of the user included in the request for the generation of the user account and set and load a data directory such that data associated with the corresponding user may be stored in association with the identification information of the user. Alternatively, the server 10 may search for pre-stored identification information of the user that matches the identification information of the user included in the request for the login with the user account and load the stored data directory in response to the retrieved identification information of the user when the matching identification information of the user is present.

In some embodiments, when the server 10 does not separately provide a service associated with the user account, the above process may not be performed.

When the terminal 20 receives the driving response of the mixed reality service, the terminal 20 may collect tracking information in real time (504). In various embodiments, the terminal 20 may collect the tracking information using the camera unit 21 and/or the sensor unit 22. The tracking information collected by the terminal 20 may include geographical position information, identification information about a reality space, three-dimensional rotation information, speed information, and the like.

For example, the terminal 20 may determine a current geographical position of the terminal 20 using a GPS sensor.

Further, the terminal 20 may analyze an image of the reality space captured by the camera unit 21 to identify a shape of the reality space, a sense of depth, and the like. By identifying the space, the terminal 20 may determine a ground of the reality space located in front of the user, and a shape, size, position of the building, and the like.

Further, for example, the terminal 20 may sense movements such as three-dimensional rotation, inclination, or a speed (movement) of the terminal 20 using the sensor unit 22.

In the present invention, the tracking information collected by the terminal 20 is not limited to the space identification information and the movement information which are described above and may include various pieces of information required for generating the virtual image, for example, marker recognition information, hand gesture identification information, and the like.

The terminal 20 may transmit the collected tracking information to the server 10 in real time (505).

The server 10 loads three-dimensional modeling data (506). In various embodiments of the present invention, the three-dimensional modeling data may be three-dimensional modeling data including a design for a building.

The server 10 may load the three-dimensional modeling data selected by the user input in the terminal 20. Alternatively, the server 10 may determine the geographical position of the terminal 20 using the received tracking information and load pre-stored three-dimensional modeling data corresponding to the position. For example, when the terminal 20 is located at a construction site of a specific geographical position, the server 10 may load three-dimensional modeling data of the building designed according to the corresponding construction site.

Thereafter, the server 10 may generate a virtual image of the loaded three-dimensional modeling data on the basis of the received tracking information (507).

The server 10 may generate the virtual image such that the building, which is provided as the three-dimensional modeling data in the reality space identified by the tracking information, may be displayed at an actual size according to design information. In this case, the server 10 may arrange the virtual image such that the corresponding building may be displayed at the designed position on the basis of the geographical position information. According to geographical position of the terminal 20, the virtual image may be an image of an exterior of the building or an image of one region inside the building. Here, the one region inside the building may correspond to a display region (a display direction) in front of the terminal 20, which is extracted from the exterior or interior image of the building on the basis of the tracking information, for example, the three-dimensional rotation information.

When the geographical position of the terminal 20 corresponds to an internal position of the building, the server 10 may generate the virtual image as a part of the interior image of the building. When the building is built with a plurality of floors, the server 10 may generate a virtual image of one region inside any floor selected by the user input or the like. In one embodiment, when the mixed reality service according to the present invention is provided after the corresponding building is actually built, the user of the terminal 20 may actually be located on a specific floor of the building. In this case, the server 10 may obtain height information of the terminal 20 from the tracking information and generate a virtual image of one region inside the floor corresponding to the height information.

The server 10 may generate the user interface for performing processing on the three-dimensional modeling data in the form of a virtual image. The user interface may include a user interface for adding, editing, or deleting a structure (position), a shape, a size, a material, a quality of the material, a color, a pattern, and facility of any object (e.g., a wall, a ceiling, a floor, a door, a window, a lighting, etc.) of the displayed building. Further, the user interface may include a user interface for inserting, editing, or deleting a memo for any object of the displayed building. Further, the user interface may include a user interface for selecting a floor of the displayed building or controlling a display for a specific facility (e.g., an electrical facility, a gas facility, a water facility, etc.).

The server 10 may arrange the user interface on the corresponding object and generate the virtual image. Alternatively, the server 10 may arrange the user interface on a specific position of a screen, for example, an upper end portion, a side portion, or a lower end portion of the screen and generate the virtual image. The server 10 may generate the virtual image by rotating and enlarging or reducing the user interface on the basis of the tracking information and/or the arrangement state of the corresponding object.

The server 10 may transmit the generated virtual image to the terminal 20 (508).

The terminal 20 may synthesize the received virtual image with the reality image captured by the camera unit 21 and generate a mixed reality image (509). The mixed reality image generated in this way may be an image in which the building corresponding to the three-dimensional modeling data is arranged at an actual size in the reality space in which the terminal 20 is located. Further, generated mixed reality image may be an image in which at least one user interface that can perform processing on any object of the displayed building is arranged at a position corresponding to the object and/or in a specific region of the screen.

The terminal 20 may display the generated mixed reality image through the display unit 24 (510).

While the mixed reality image is displayed, the terminal 20 continuously collects the tracking information in real time and transmits the collected tracking information to the server 10. Further, the server 10 may generate a virtual image on the basis of the tracking information that is continuously received and transmit the virtual image to the terminal 20. The terminal 20 may synthesize the virtual image changed according to the tracking information collected in real time with the reality image and display the mixed reality image to the user.

Examples of the mixed reality image displayed as described above are illustrated in FIGS. 7 and 8.

Figure 7:
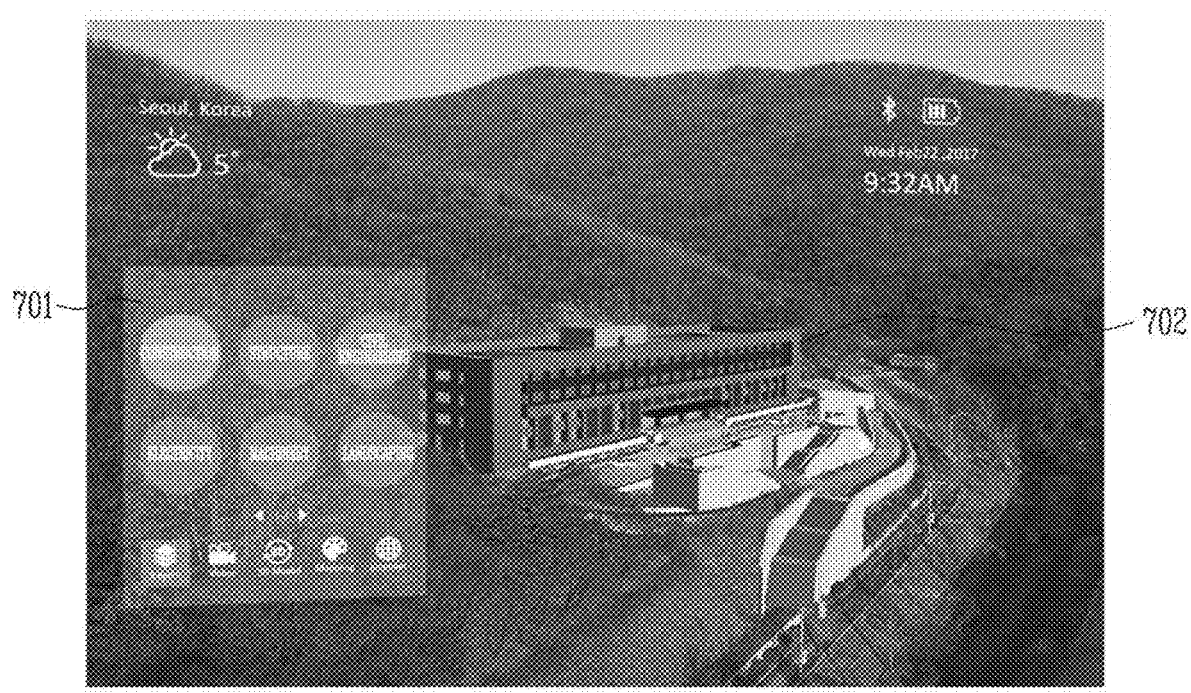
FIGS. 7 and 8 are diagrams illustrating examples of a mixed reality image according to the present invention.
Figure 8:
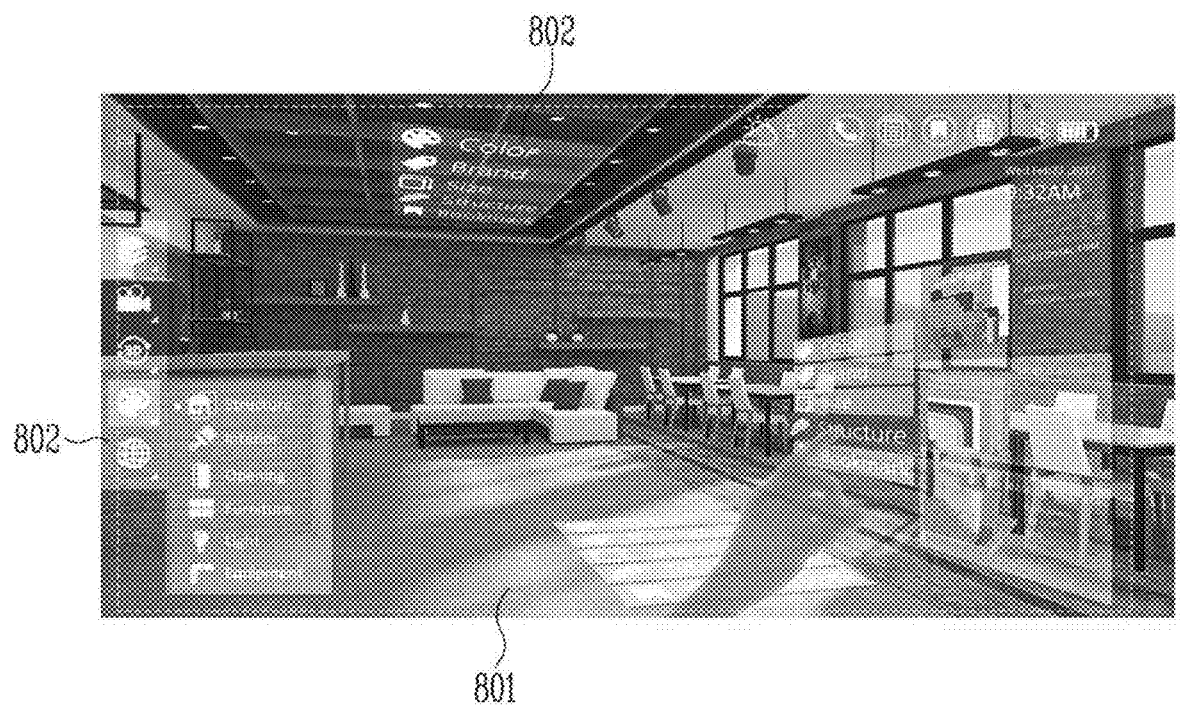

As illustrated in FIGS. 7 and 8, three-dimensional modeling images 701 and 801 are displayed at actual sizes on corresponding sites. When the geographical position of the terminal 20 is outside the design position of the building, the user may feel as if the building having an actual size is displayed at the design position due to the displayed mixed reality image, as illustrated in FIG. 7. Conversely, when the geographical position of the terminal 20 is inside the design position of the building, the user may feel as if the user is located inside the built building due to the three-dimensional modeling data, as illustrated in FIG. 8.

According to the present invention, the user may indirectly and realistically experience the shape of the building when the building is actually built at the construction site before the building is actually designed. In one embodiment, when the mixed reality service according to the present invention is used after the building is actually built according to the design content of the three-dimensional modeling data, the user may compare the built building with the three-dimensional modeling data displayed as a mixed reality and determine whether the building was built to match the designed modeling data. Further, the user may compare the built building with the three-dimensional modeling data displayed as a mixed reality, identify a damaged or changed part after building, and perform maintenance on the damaged or changed part.

As described above, in order to perform available control on any object, at least one of user interfaces 702 and 802 may be displayed on the displayed three-dimensional modeling data. In the present invention, it is possible to perform processing on the three-dimensional modeling data through the user interface. A description thereof will be given with reference to FIG. 6.

Figure 6:
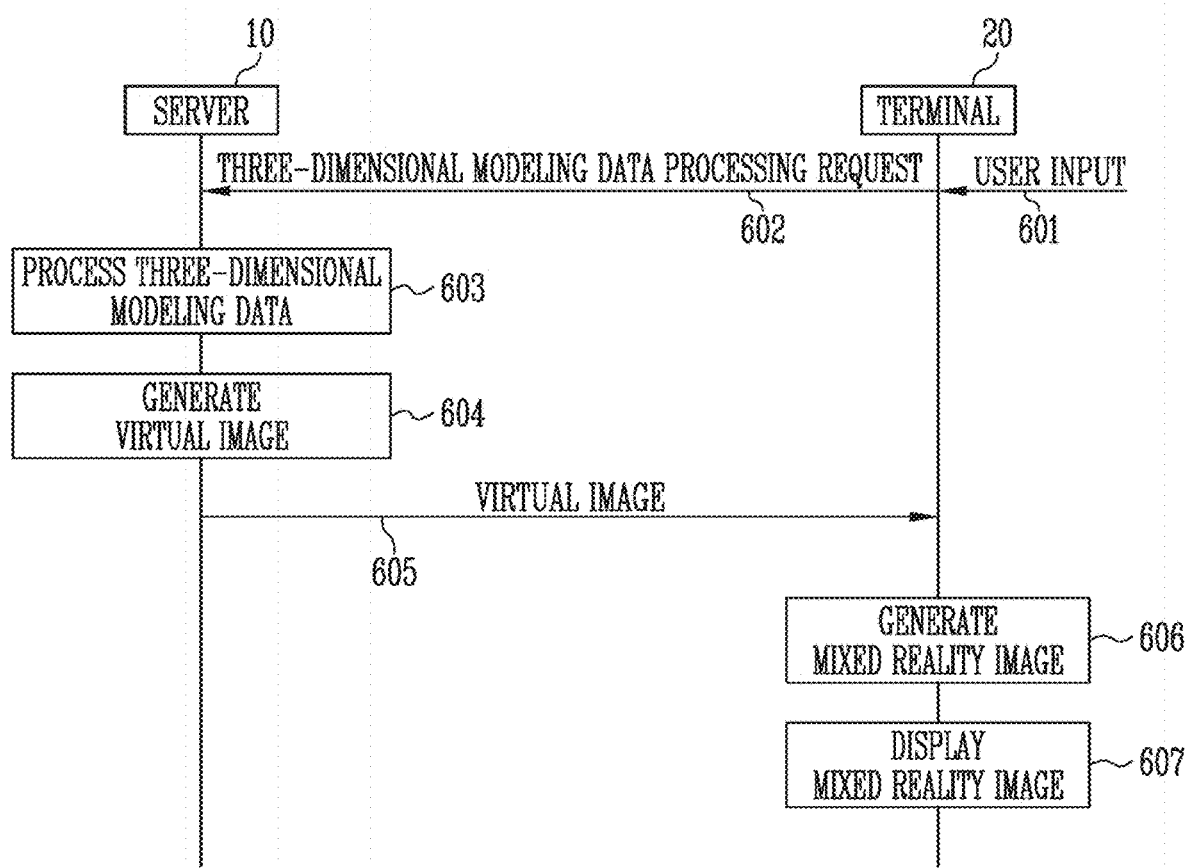
FIG. 6 is a flowchart illustrating a method for performing processing on three-dimensional modeling data in a mixed reality service providing method according to the present invention.

FIG. 6 is a flowchart illustrating a method of performing processing on three-dimensional modeling data in the mixed reality service providing method according to the present invention.

Referring to FIG. 6, while the mixed reality image is displayed, the terminal 20 may sense a user input which is input using the camera unit 21, the sensor unit 22, and/or the input unit 23 (601).

The user input may include information for editing a structure, a shape, a size, a material, a quality of the material, color, a pattern, and facility of any object as a process for design information in the three-dimensional modeling data.

The user input may be received through the displayed user interface. In various embodiments of the present invention, the terminal 20 may sense the user input by identifying a hand gesture of the user using an infrared camera. For example, when a hand gesture pointing at a specific position with a finger is identified, the terminal 20 may sense a user input for executing the user interface displaced at the position pointed by the finger Alternatively, for example, when a hand gesture folding and unfolding any finger is identifies, the terminal 20 may sense a user input for displaying a menu or a list corresponding thereto. Alternately, for example, the terminal 20 may identify the number of user fingers and sense a user input for displaying a mixed reality image on a number of floors corresponding to the number of user fingers. In the present invention, the user input corresponding to the hand gesture of the user is not particularly limited to the type or shape thereof.

The terminal 20 may transmit a request for processing of three-dimensional modeling data to the server 10 in response to the user input (602).

The server 10 may process the three-dimensional modeling data in response to the request for the processing the three-dimensional modeling data (603). The server 10 may change a size, a layout, color, a quality of a material, a pattern, or the like of the object selected by the request for the processing in the three-dimension modeling data, in response to the request for the processing.

The server 10 may perform management and storage operations on the three-dimensional modeling data, such as storing the processed three-dimensional modeling data, storing the three-dimensional modeling data before processing for backup, or the like.

Thereafter, the server 10 may generate a virtual image on the basis of the edited three-dimensional modeling data (604) and transmit the generated virtual image to the terminal 20 (605). The terminal 20 may generate a mixed reality image on the basis of the virtual image transmitted from the server 10 (606) and display the mixed reality image (607), and thus the user may virtually experience various shapes of objects in the building corresponding to the three-dimensional modeling data.

In various embodiments, by storing the three-dimensional modeling data displayed as the mixed reality image in the server 10, other terminals may check the processing status of the three-dimensional modeling. Alternatively, the terminal 20 may share the three-dimensional modeling data with other terminals in real time through a mixed reality conference.

It will be understood by those skilled in the art that various changes in form and details may be made without departing from the spirit and scope of the present invention. In addition, the embodiments disclosed in this specification and the accompanying drawings are only examples to easily describe the contents of the present invention and aid in understanding of the present invention, and the present invention is not limited thereto. Therefore, the scope of the present invention should be interpreted as including all the modified or deformed forms derived on the basis of the technological scope of the present invention in addition to the embodiments disclosed herein.

The invention claimed is:

1. A method of providing a mixed reality service of a server, the method comprising:
    loading three-dimensional modeling data including design information about an arbitrary building;
    generating virtual images of the three-dimensional modeling data and at least one user interface on the basis of tracking information transmitted from a terminal; and
    transmitting the virtual images to the terminal,
    wherein the tracking information includes at least one of geographical position information of the terminal, identification information about a reality space in which the terminal is located, three-dimensional rotation information, and speed information, the virtual image is generated such that the building is displayed at an actual size according to the design information and is synthesized with a reality image in at least one terminal and the synthesized image is displayed as a mixed reality image, when a geographical position of the terminal corresponds to an internal position of the building displayed at the actual size, the virtual image is generated using an interior image of the building, and when the geographical position of the terminal corresponds an external position of the building, the virtual image is generated using an exterior image of the building, and the generating of the virtual image includes, when the building is built with a plurality of floors, obtaining the interior image for any floor selected by an input received from the terminal or the tracking information and generating the virtual image on the basis of the obtained interior image.

2. The method of claim 1, wherein the generating of the virtual images includes:

obtaining an exterior or interior image of the building according to the geographical position information of the terminal;

extracting one region corresponding to a display region in front of the terminal from the obtained image according to the tracking information of the terminal; and generating the virtual image from the extracted region.

3. The method of claim 1, wherein the at least one user interface includes a user interface for at least one of addition, edit, delete, and memo management of the design information about the building.

4. The method of claim 3, wherein the generating of the virtual images includes arranging the user interface for at least one object on the at least one object in the building and generating the virtual image.

5. The method of claim 4, further comprising:

receiving a request for processing of the three-dimensional modeling data through the at least one user interface;

editing the three-dimensional modeling data in response to the request for the processing;

regenerating the virtual image on the basis of the edited three-dimensional modeling data; and transmitting the regenerated virtual image to the terminal.

6. The method of claim 1, further comprising, after the transmitting of the virtual images to the terminal:

receiving changed tracking information from the terminal;

regenerating the virtual image of the three-dimensional modeling data and the at least one user interface on the basis of the changed tracking information; and transmitting the regenerated virtual image to the terminal.

7. A system for providing a mixed reality service, the system comprising:

a terminal configured to collect and transmit tracking information while a mixed reality service is used; and a server configured to load three-dimensional modeling data including design information about an arbitrary building, generate virtual images of the three-dimensional modeling data and at least one user interface on the basis of the tracking information transmitted from the terminal, and transmit the generated virtual images to the terminal, wherein the tracking information includes at least one of geographical position information of the terminal, identification information about a reality space in which the terminal is located, three-dimensional rotation information, and speed information, the virtual image is generated such that the building is displayed at an actual size according to the design information and is synthesized with a reality image in at least one terminal and the synthesized image is displayed as a mixed reality image, when a geographical position of the terminal corresponds to an internal position of the building displayed at the actual size, the virtual image is generated using an interior image of the building and when the geographical position of the terminal corresponds to an external position of the building, the virtual image is generated using an exterior image of the building, and when the building is built with a plurality of floors, the server obtains the interior image for any floor selected by an input received from the terminal or the tracking information and generates the virtual image on the basis of the obtained interior image.

8. The system of claim 7, wherein the server obtains an exterior or interior image of the building according to the geographical position information of the terminal, extracts one region corresponding to a display region in front of the terminal from the obtained image according to the tracking information of the terminal, and generates the virtual image.

9. The system of claim 7, wherein the at least one user interface includes a user interface for at least one of addition, edit, delete, and memo management of the design information about the building.

10. The system of claim 9, wherein:

the terminal transmits a request for processing of the three-dimensional modeling data on the basis of a user input received through the at least one user interface to the server; and the server edits the three-dimensional modeling data in response to the request for the processing, regenerates the virtual image on the basis of the edited three-dimensional modeling data, and transmits the regenerated virtual image to the terminal.

* * * * *